United States Patent
Fuller et al.

(10) Patent No.: US 6,191,021 B1
(45) Date of Patent: *Feb. 20, 2001

(54) METHOD OF FORMING A LOW-RESISTANCE CONTACT ON COMPOUND SEMICONDUCTOR

(75) Inventors: Clyde R. Fuller; Joseph B. Delaney, both of Plano; Thomas E. Nagle, Dallas, all of TX (US)

(73) Assignee: TriQuint Semiconductors Texas, Inc., Hillsboro, OR (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/839,120

(22) Filed: Apr. 23, 1997

Related U.S. Application Data (62) Division of application No. 08/014,920, filed on Feb. 8, 1993.

(51) Int. Cl.[7] ........................................ H01L 21/28
(52) U.S. Cl. .................. 438/606; 438/648; 438/656; 438/683; 438/785
(58) Field of Search ........................ 438/605, 606, 438/519, 46, 29, 170, 186, 172, 181, 184, 572, 649, 626, 627, 362, 635, 648, 656, 683, 785

(56) References Cited

U.S. PATENT DOCUMENTS

| | | |
|---|---|---|
| 4,179,533 | 12/1979 | Christou et al. ................. 427/84 |
| 4,186,410 | 1/1980 | Cho et al. ........................ 357/67 |
| 4,330,343 | 5/1982 | Christou et al. ................. 148/1.5 |
| 4,849,802 | 7/1989 | Jackson et al. .................. 257/745 |
| 4,889,831 | 12/1989 | Ishii et al. ...................... 437/184 |
| 4,951,121 | 8/1990 | Furukawa et al. ............... 357/71 |
| 5,055,908 | 10/1991 | Fuller et al. ..................... 357/71 |
| 5,077,231 | * 12/1991 | Plumton et al. ................. 438/170 |
| 5,124,270 | 6/1992 | Morizuka ......................... 437/31 |
| 5,243,207 | 9/1993 | Plumton et al. ................. 257/192 |
| 5,430,327 | 7/1995 | Wu et al. ......................... 257/768 |
| 5,485,025 | 1/1996 | Chau et al. ...................... 257/197 |
| 5,512,496 | * 4/1996 | Chau et al. ...................... 437/31 |
| 5,550,089 | * 8/1996 | Dutta et al. ...................... 437/225 |
| 5,569,944 | * 10/1996 | Delaney et al. .................. 257/198 |
| 5,760,479 | * 6/1998 | Yang et al. ....................... 257/778 |
| 5,804,877 | 9/1998 | Fuller et al. ..................... 257/745 |

FOREIGN PATENT DOCUMENTS

| | | |
|---|---|---|
| 0 283 278 | 3/1988 | (EP) . |
| 1-194468 | 8/1989 | (JP) . |

* cited by examiner

*Primary Examiner*—David Nelms
*Assistant Examiner*—Renee Berry
(74) *Attorney, Agent, or Firm*—Skjerven Morrill MacPherson LLP; Brian D. Ogonowsky; Daniel P. Stewart

(57) ABSTRACT

Generally, and in one form of the invention, a method is disclosed for forming an ohmic contact on a GaAs surface 20 comprising the steps of depositing a layer of InGaAs 22 over the GaAs surface 20, and depositing a layer of TiW 24 on the layer of InGaAs 22, whereby a reliable and stable electrical contact is established to the GaAs surface 20 and whereby Ti does not generally react with the In.

13 Claims, 5 Drawing Sheets

METHOD OF FORMING A LOW-RESISTANCE CONTACT ON COMPOUND SEMICONDUCTOR

This is a division of application Ser. No. 08/014,920, filed Feb. 8, 1993.

FIELD OF THE INVENTION

This invention generally relates to low-resistance contacts on compound semiconductors.

BACKGROUND OF THE INVENTION

It is well known that low resistance ohmic contacts to GaAs are difficult to obtain due to a 0.8 eV Shottky barrier associated with the metal-GaAs interface. It is also known in the art that the metal-InGaAs interface produces a nearly zero Shottky barrier height and hence a low contact resistance. Ohmic contact may be made to GaAs by interposing an $In_xGa_{1-x}As$ layer, with x=0 at the GaAs interface and graded to x≈0.8 at the metal-InGaAs interface, between the GaAs layer and the metal contact. An advantage of this structure is that post-deposition alloying of the contact is not necessary.

In the fabrication of semiconductor circuits from Group III-V compounds, Au and Au-alloys are the most commonly employed metals for making electrical contact at the device level. Specifically, AuGe/Ni/Au, Ti/Pt/Au, and AuZn are a few of the metallization schemes that have been used to make contact to GaAs as well as to InGaAs. However, as demand for better device performance continues to increase, the need for a lower resistance contact scheme to InGaAs, in particular, has become apparent.

SUMMARY OF THE INVENTION

As has been stated hereinabove, the use of an interposed layer of InGaAs to form contact between a metal and GaAs is known in the art. However, the inventors hereof have found that Au-based metallization schemes, such as AuGe/Ni/Au, are susceptible to spiking. In efforts to overcome this problem, a refractory metal-based stack, such as Ti/Pt/Au has been used. This metallization, however, has been found to produce a contact that is unstable and generally high in contact resistance, apparently because the Ti reacted with the In. Indeed, another Ti-based metal, nitrided TiW, i.e. TiW sputtered in the presence of $N_2$, was used in the belief that the $N_2$ would keep the Ti from reacting with the In in the InGaAs. This, however, suffered from poor adhesion and high compressive stress.

In further experimentation by the inventors, TiW was used as a contact on InGaAs. Surprisingly, this contact scheme has proven to have a low resistance and is stable. Surprisingly, the Ti in the TiW film appears to be sufficiently bound by the W to keep it from reacting with the In in the InGaAs layer.

In one form of the invention, a method is disclosed for forming an ohmic contact on a GaAs surface comprising the steps of depositing a layer of InGaAs over the GaAs surface, and depositing a layer of TiW on the layer of InGaAs, whereby a reliable and stable electrical contact is established. In another form of the invention, an ohmic contact to a GaAs surface is disclosed, the ohmic contact comprising a layer of InGaAs over the GaAs surface, and a layer of TiW on the layer of InGaAs. In still another form of the invention a bipolar transistor is disclosed. The transistor comprises a mesa, and the mesa comprises a first semiconductor layer, a layer of InGaAs atop the first semiconductor layer; and a layer of TiW atop the layer of InGaAs.

In addition to its advantage in contact resistance, TiW has been proven to provide superior adhesion as compared to nitrided TiW possibly because TiW exhibits less undercutting when etched with common etchants than does nitrided TiW. Also, as disclosed in co-assigned U.S. Pat. No. 5,055,908, TiW possesses the advantage of selectable stress, i.e. the stress of the TiW film (over a broad range from compressive to tensile) is found to be dependent upon sputter deposition pressure. Nitrided TiW, on the other hand, has been found to produce only a compressively stressed film. The ability to select stress in metallic films is known to be important in producing reliable contacts between dissimilar materials under conditions such as temperature cycling.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

An advantage of this invention can be the formation of a stable, reliable, and low-resistance ohmic contact directly to InGaAs, and indirectly to GaAs. As is well known in the art, making contact to InGaAs is of concern because the formation of a stable contact to GaAs is made difficult because of a 0.8 eV Shottky barrier at the typical metal-GaAs interface. In contrast, a metal-InGaAs interface produces a nearzero Shottky barrier and therefore a lower contact resistance. The choice of the metal in the contact system has proven to be another way to lower the contact resistance. Commonly used metallization schemes such as AuGe/Ni/Au and Ti/Pt/Au produce high resistance contacts that also suffer from reliability problems. AuGe/Ni/Au is susceptible to spiking through the InGaAs, and when Ti/Pt/Au was used on highly doped InGaAs by the inventors hereof, the resulting contacts corroded over a short period and the contact resistance increased by more than a factor of three. It is believed that the Ti reacted with the In to form a highly resistive intermetallic compound. Consequently, contact systems in which Ti was not present (WSi, for example) were used, but also resulted in a high resistance contact that suffered from the additional disadvantage of providing a highly undercut etch profile.

In further experimentation, TiW that had been sputtered in the presence of $N_2$ was used in the belief that the N would bind the Ti to keep it from reacting with the In. However, this contact suffered from poor adhesion due to deep undercutting at the metal-InGaAs interface. However, in another experiment, TiW was tried on InGaAs because it was readily available, although there was little hope of the Ti not reacting with the In. Surprisingly, the contact as deposited possessed a low resistance whereas other systems required anneal or alloy conditions to improve resistance. An explanation of the low resistance might be that the Ti is sufficiently bound by the W to keep it from forming an alloy with In, and the fact that annealing or alloying a metal contact on InGaAs is typically unnecessary also helps prevent undesired reactions from occurring.

The TiW/InGaAs contact has been found to promote less undercutting than does nitrided TiW. Plasmas containing F seem particularly to etch at the nitrided TiW-InGaAs interface more so than at the TiW-InGaAs interface. It should be noted that a similar etch difference has been observed with wet chemical etches as well.

Additionally, TiW can be induced, through the selection of the proper sputter deposition pressure, to create a layer whose stress varies from about $5 \times 10^{10}$ dynes/cm$^2$ compressive to about $5 \times 10^{10}$ dynes/cm$^2$ tensile. The ability to select the stress that a layer possesses in a finished structure is important in preventing delamination and cracking in temperature-stressed structures comprising layers of dissimilar materials. This particular aspect of TiW layers was addressed in co-assigned U.S. Pat. No. 5,055,908.

Figure 1:
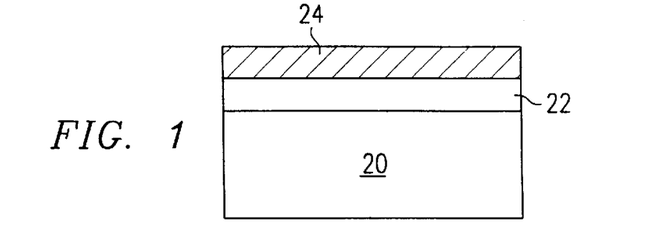
FIG. 1 is a cross-sectional diagram of a first preferred embodiment of the invention.

In a preferred embodiment of the invention, shown in FIG. 1, a 1750±750 Angstrom layer of TiW 24 (generally 5–20% wt. Ti and 80–95% wt. W and more preferably about 10% wt. Ti and 90% wt. W) alloy is sputter-deposited on a layer of InGaAs 22, typically $In_{0.5}Ga_{0.5}As$, which has been deposited on a GaAs wafer 20. In another embodiment, it is desired to establish a low resistance contact to a heterojunction bipolar transistor (HBT). This contact may be to the emitter, collector, or base. HBTs may be generally classified as emitter-up or collector-up, depending on whether the emitter or collector extends above the surrounding substrate in the form of a mesa.

Figure 2:
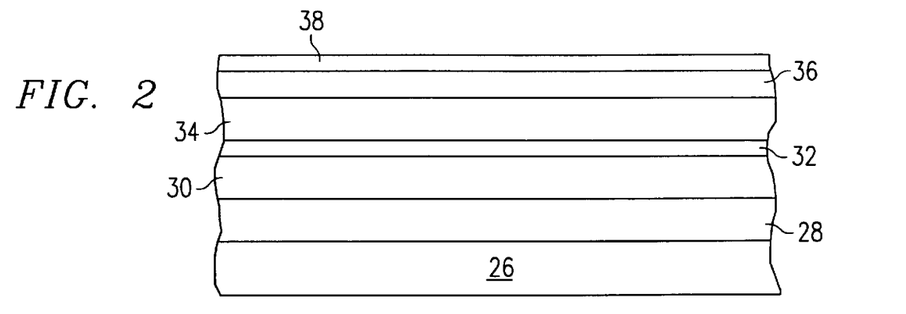
FIGS. 2 to 14 are cross-sectional diagrams of a second preferred embodiment at various fabrication steps.
Figure 3:
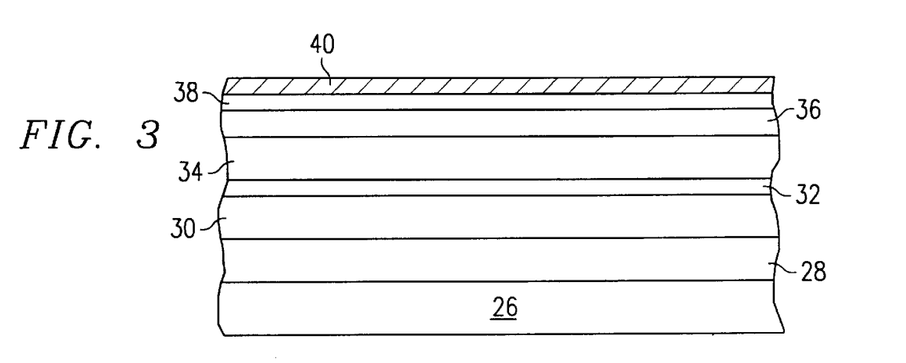

In this embodiment, an emitter-up configuration is described, though one may appreciate that a collector-up transistor may be similarly fabricated. The material structure is shown in FIG. 2. The transistor is fabricated on a semi-insulating GaAs substrate or wafer 26, for example, and comprises: a subcollector layer 28, typically GaAs approximately 1.0 μm in thickness and doped with Si for example to a concentration of approximately $1.5 \times 10^{18}$ cm$^{-3}$; a collector layer 30, typically GaAs, approximately 0.65 μm in thickness and doped with Si for example to a concentration of approximately $8.0 \times 10^{15}$ cm$^{-3}$; a base layer 32, typically GaAs, approximately 0.05 μm in thickness and doped with C for example to a concentration of approximately $1.5 \times 10^{19}$ cm$^{-3}$; an emitter layer 34, in this embodiment of AlGaAs but may alternatively be of GaInP, approximately 0.1 μm in thickness and doped with Si for example to a concentration of approximately $5 \times 10^{17}$ cm$^{-3}$; a buffer layer 36, typically GaAs, approximately 0.15 μm in thickness and doped with Si for example to a concentration of approximately $3 \times 10^{18}$ cm$^{-3}$; and an InGaAs cap layer 38 approximately 0.05 μm in thickness and doped with Si for example to a concentration of approximately $1 \times 10^{19}$ cm$^{-3}$. As in the first embodiment, a TiW layer 40 is sputtered on the InGaAs layer 38, as shown in FIG. 3.

Figure 4:
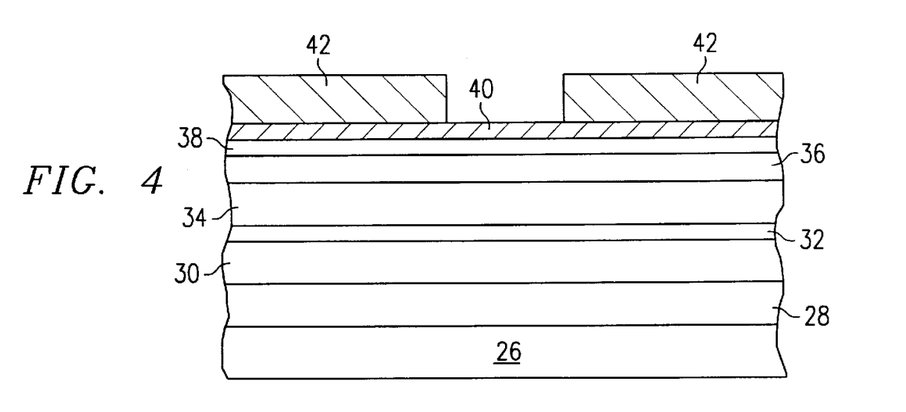

The emitter geometry is formed by lift-off techniques in which the emitter pattern is formed as openings in an image reversal photoresist film. Adhesion promoter (not shown) is spun over the TiW coated wafer. Photoresist 42 is then spun to a thickness of approximately 1.8 μm followed by a track bake at about 90° C. for approximately 90 seconds. The wafer is then blanket exposed at 365 nm for about 0.7 seconds, track baked at about 125° C. for approximately 50 seconds, exposed in a stepper apparatus, and batch developed in a solution of 1:1, photoresist developer and water, for about 6 minutes. The exact conditions will vary with resist batch, as will the bakes, blanket exposure, pattern exposure, and develop times for optimum resist sidewall profile also change. This process leaves the TiW surface exposed in the desired location of the emitter contact, as shown in FIG. 4.

Figure 5:
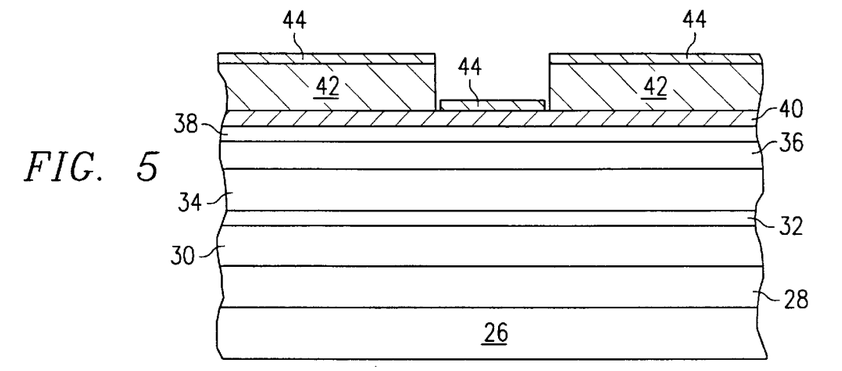

Following the formation of the image reversal photoresist pattern, the wafer is submitted to a descum or light ash to remove resist or other organic residues in the pattern, dipped in buffered HF (Bell #2 for example) to remove surface oxides, rinsed and spin rinse dried. Au-based emitter metallization 44 is evaporated onto the wafer, depositing through the openings in the photoresist onto the previously deposited TiW contact layer, as shown in FIG. 5. The photoresist is then "lifted-off" by attacking it with a solvent at patterned region sidewalls not covered by the evaporated metal. Because the wafer surface is entirely covered with metal (TiW) prior to the evaporation, the radiant energy from the metal evaporation source will be more efficiently collected than when the wafer is bare GaAs. This can result in excessive heating of the photoresist, thereby altering the profile such that evaporated metal deposits on the sidewall of the emitter pattern may produce unwanted "wings" or metal tags that can cause emitter-base shorts. In a specific embodiment of this invention, the emitter metal is deposited by electron beam evaporation. This Au-based metal system 44 consists of Ti (450 Angstroms)/ Pt (400 Angstroms)/ Au (3800 Angstroms), for example. In order to ensure minimum heating during this evaporation, the Ti rise, soak, and predeposition times are set at about 5 seconds each. This permits the Ti to be ready to evaporate when the system shutter opens without spending excessive time at each of these processes, thereby resulting in much less damage to the resist profile from radiant heating during evaporation of the Ti. For similar reasons, Pt rise, soak and predeposition times are set at about 5, 5 and 15 seconds, respectively.

Figure 6:
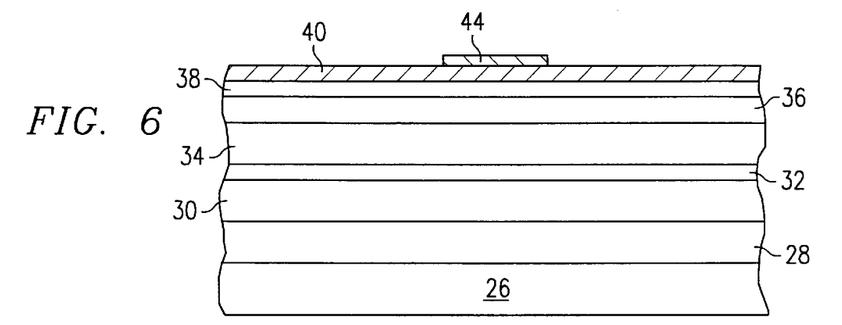

Following evaporation, the photoresist is lifted off in solvent, leaving the structure shown in FIG. 6. Typically, acetone is employed with soaks, ultrasonic agitation or spraying while the wafer is being spun. While the details of the lift-off process can adversely affect the patterning results, almost any process that leaves a debris-free surface is suitable. The resulting patterned metal 44 is used as a mask to etch the emitter geometry into the TiW and then into the semiconductor underneath.

An alternative method of forming the emitter geometry involves sputtering sequential layers of TiW then Au over the wafer, spinning photoresist, exposing and developing the pattern, and then pattern etching the Au and TiW layers to form the emitter metal geometry which serves as a pattern mask for wet chemical or reactive ion etching of the InGaAs, GaAs, and other layers that form the emitter structure. This process has the following advantages: (a) the use of pattern etching instead of lift-off leaves a cleaner edge to the pattern and alleviates the formation of the metal tags that can occur from metal deposition onto lift-off resist pattern sidewalls, and (b) the full emitter metal is put down in a single vacuum deposition.

Figure 7:
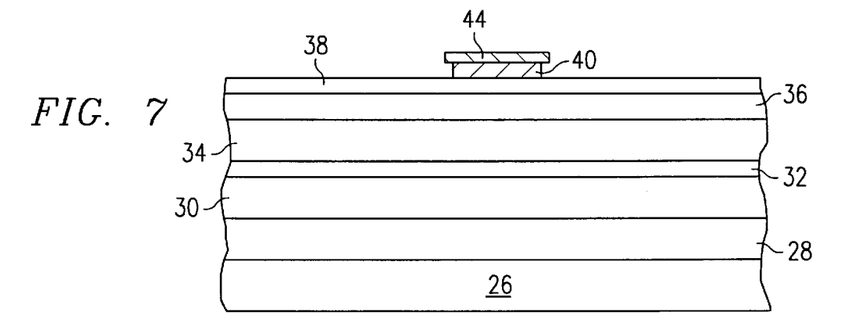
Figure 8:
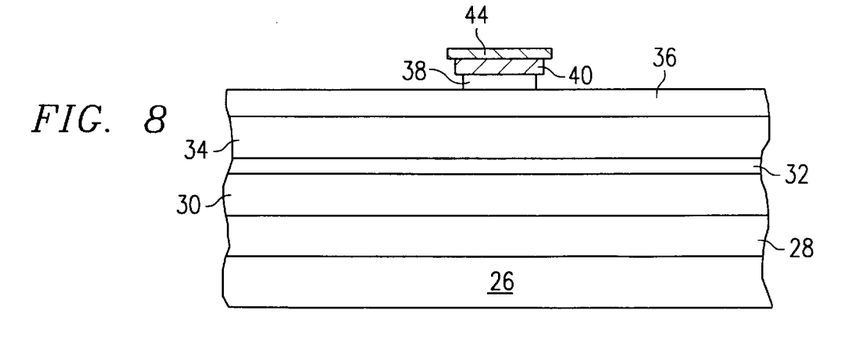
Figure 9:
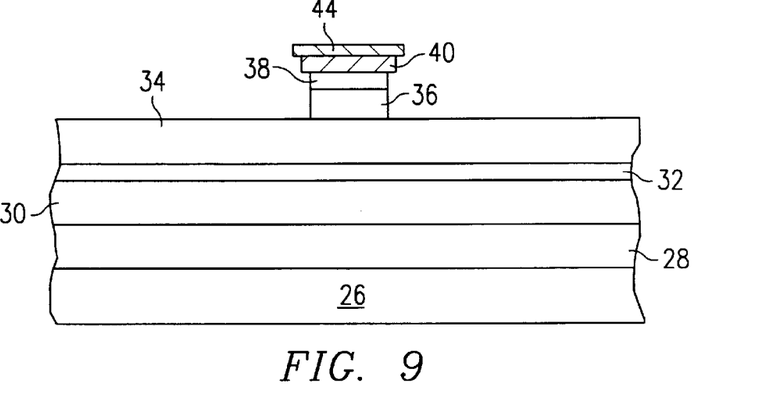

In order to form the emitter mesa of the transistor, a selective reactive ion etching (RIE) process is employed to etch through the TiW 40, stopping on the InGaAs 38 surface. The resulting structure is shown in FIG. 7. The InGaAs 38 is etched in a non selective, timed, wet etch which results in the structure of FIG. 8. The GaAs buffer 36 is etched in a Reactive Ion Etch process that stops on the AlGaAs emitter layer 34, giving a positive reference for etching the balance of the emitter region in a controlled rate, controlled undercutting, timed RIE etch permitting precise control for stopping safely in the 500 to 1000 angstrom thick p+ GaAs base region 32. For example, the InGaAs layer 38 is wet etched for a sufficient time to clear and etch into the GaAs buffer 36. The GaAs is RIE etched in a gas mixture that will not etch AlGaAs, and thus the etch stops on the AlGaAs emitter layer 34. The distance to the thin p+ base region 32 is precisely known at this point. Without the selectivity of the initial RIE etch with respect to AlGaAs, costly and inaccurate step height measurements would be required after the InGaAs wet and GaAs RIE etch to ensure etching into but not through the base region 32. An illustration of the structure, etched to the top of the AlGaAs layer, is shown in FIG. 9. It may be appreciated that a similar selective etch procedure could be applied to emitter layers comprising materials other than AlGaAs, e.g. GaInP.

In a specific embodiment of the emitter etch process described hereinabove the wafer is rigorously cleaned, with a final plasma ash step to ensure that the edges of the metal emitter contact patterns 44 are generally clean and free of debris, and the surface of the unetched TiW 40 is generally free of any possible etch masking contaminant. The final plasma ash, which may be performed in either a radio frequency plasma reactor or in a microwave frequency down stream reactor in $O_2$, $O_2$:He, or $O_2$:$N_2$O, or similar gas mixtures, is an important last step prior to RIE etching of the TiW contact 40.

The wafers are immediately placed in an RIE apparatus. The TiW 40 is etched in $CF_4$+8% $O_2$ @250 watts, 30 millitorr, 40° C., for example, to a visible clearing of the TiW layer 40 plus 50% over-etch. The etch stops on the InGaAs 38 and undercuts the TiW layer by about 1500 angstroms or less. Following RIE of the TiW 40, the wafers are lightly cleaned through a water spin-rinse dry. The InGaAs layer 38 is then removed in a 1:8:160 solution of $H_2SO_4$:$H_2O_2$:$H_2O$ for about 25 seconds. The solution is mixed fresh, and allowed to age for about 30 minutes prior to using to establish a repeatable etch rate for the process. The wafers are rinsed in flowing deionized water, then spin-rinsed and dried.

In order to ensure removal of any masking organic residue, the wafers are ashed for about 5 minutes at 150 watts, 900 millitorr in a barrel type asher, etched 30 seconds in 40:1 $NH_4OH$, rinsed in flowing deionized water, then spin-rinsed and dried prior to placing into the RIE for etch to the AlGaAs emitter layer 34. No more than about 30 minutes is allowed between the etch rinse and placement in the reactor. The wafers are RIE etched at about 80° C., 200 watts, 95 mt in gas flows of: 4.5% $H_2$ in He, 20 sccm; $CCl_4$, 10 sccm. Etch rate is approximately 350 angstroms/minute, and is timed to etch to the AlGaAs emitter layer 34 with about 50% over etch. The timing is not critical since the etch does not appreciably attack the AlGaAs emitter layer 34. Further, since the etch depth is to the graded AlGaAs emitter layer 34 surface, the remaining etch depth to the approximately 1000 Angstrom thick p+ base region 32 is precisely known from the original HBT epitaxial structure. As a check on the process and to serve as a reference for the next and more critical etch to base step, etch step heights are measured at 5 positions on the wafers. This step height results from the composite thickness of the TiW 40, InGaAs 38, and GaAs 36 layers above the AlGaAs emitter 34. In another preferred embodiment of this process step, $BCl_3$+$SF_6$ may be substituted for $CCl_4$. The $SF_6$ keeps $BCl_3$ from etching AlGaAs, which it would otherwise. Surprisingly, it appears that a variety of etchants fulfill the requirements of etching GaAs, but stopping on AlGaAs. $CCl_4$ is just one gas in the group that includes Chlorocarbons and Chlorofluorocarbons that, when used in a RIE arrangement, etches GaAs, but stops on AlGaAs. Additionally, it appears that non-Ar Cl-based gases in general, of which $BCl_3$ is one, when used with a source of F, like $SF_6$, will also perform the required etch (Ar appears to increase the sputter rate and can make the etch less likely to stop on AlGaAs, He appears to have benefits over Ar as a buffering gas). The non-C-containing etches also avoid the problems associated with Chlorocarbons and Chlorofluorocarbons such as damage to the earth's ozone layer.

A non-selective, reproducible etch rate $BCl_3$+$Cl_2$ RIE etch process may now be used to etch to clear and safely stop in the necessarily thin p+ base region 32. However, Cl will remain from the etch and can cause corrosion of the Au contact 44 under bias conditions. This Cl can be removed by exposure to rf plasma in $CF_4$. Pilot wafers are etched to verify and recalibrate etch rate in the reactor prior to etching the device wafers. In a preferred embodiment of this invention, the etch to base process is performed as follows:

a. The wafers are etched 30 seconds in 40:1 $NH_4OH$, rinsed in flowing deionized water, then spin-rinsed and dried. No more than about 30 minutes is allowed between the etch, rinse and placing into the reactor.

b. Wafers are loaded into the RIE chamber. Gas flows ($BCl_3$ @200 sccm, 4% $H_2$ in He @30 sccm, and $Cl_2$ @8 sccm) are established at 50 millitorr. Wafers are RIE etched, by time established in etch rate determination and etch distance, to base 32 in those gases at a dc bias of −45 v. A probe for surface breakdown is employed for verification of etch to base 32.

Figure 10:
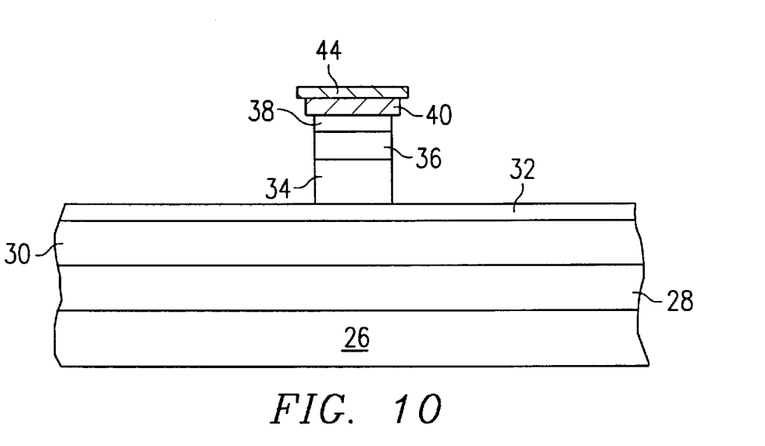

The total etch process (through the TiW 40 to the p+ base 32) results in undercutting the emitter contact pattern such that overhang of the TiW-Ti-Pt-Au emitter geometry pattern shadows the emitter mesa side walls, as shown in FIG. 10, thereby permitting self aligned base contacts with normal incidence evaporation. If non-self-aligned base contacts are used, the emitter mesa undercut ensures that close placement misalignment does not result in emitter-base shorting.

Figure 11:
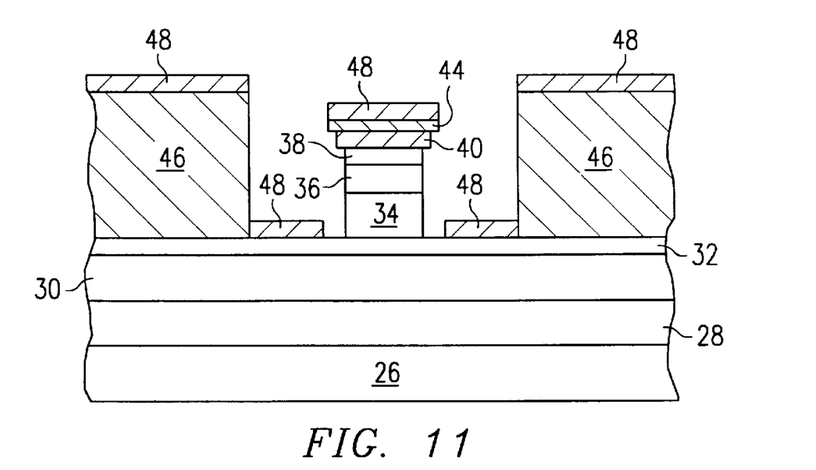

In a preferred embodiment of this invention, with emitter self- or optically-aligned base contacts, a reverse image photoresist 46 pattern is made with a process similar to that described for the lift off patterned emitter contact geometry. With either optically or self aligned base contacts, the process is essentially the same because only the photoresist 46 patterns differ. Ti-Pt-Au films, in thicknesses of 500, 250, and 1500 Angstroms 48 are sequentially evaporated and lifted off. Film thicknesses are deliberately low to ensure that with close to emitter placement, or with self alignment, the top of the base contact will be safely below the emitter metal. Post lift-off clean-ups are essentially the same as with the emitter Ti-Pt-Au process. The structure, with base contacts, is shown in FIG. 11.

Figure 12:
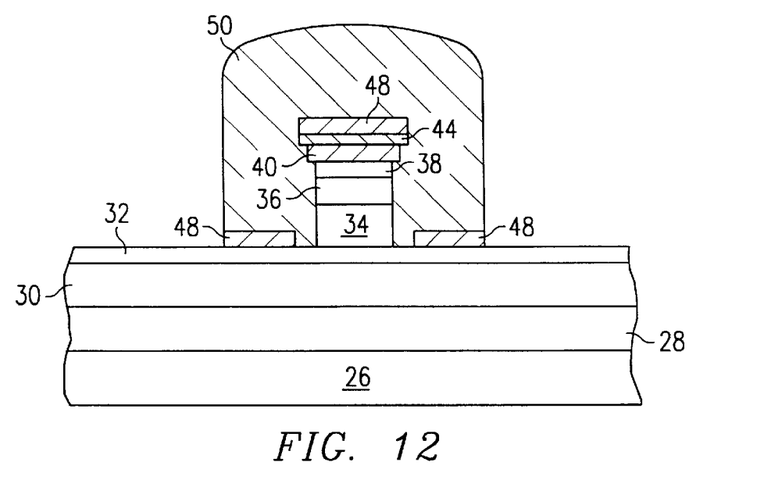

A base mesa, defined in positive photoresist 50 and sized so the edges of the base mesa resist pattern are essentially coincident with edges of the base contacts 48, is etched through the base 32 to the collector layer 30 to minimize base collector capacitance. The base mesa etch process is essentially identical to the base etch, except the time is set to correspond to the base layer 32 thickness plus about 1000 Angstroms. FIG. 12 is an illustration showing the photoresist 58 that defines the base mesa.

Figure 13:
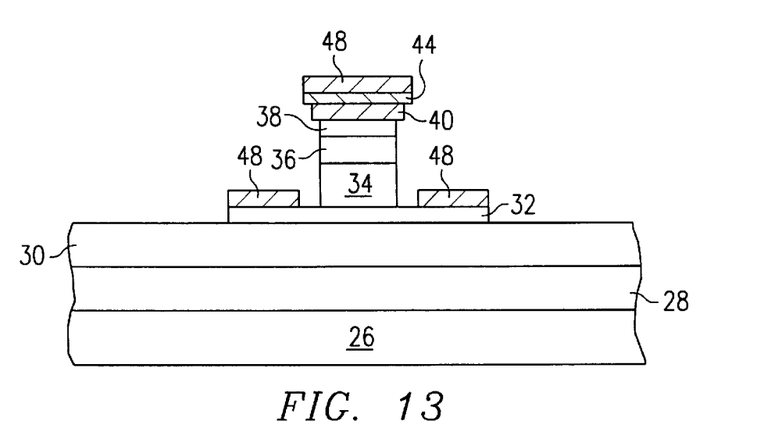

In a specific embodiment of the base mesa etch process, the wafers are etched 30 seconds in 40:1 $H_2O$:$NH_4OH$, rinsed in flowing deionized water, and spin rinse dried. Adhesion promoter is applied, and positive photoresist is spun on, baked, aligned, exposed, developed, ashed 3 minutes at 150 watts, 900 millitorr in a barrel type asher, and baked 30 minutes @100° C. The wafers are again ashed 3 minutes at 150 watts, 900 mt in a barrel type asher. At this point, the resist thickness is measured to serve as a rough base line for determining etch depth. The wafers are then dipped 10 seconds in buffered HF to remove native oxides, rinsed in flowing deionized water, and spin rinse dried. The wafers are then etched as with the AlGaAs portion of the base etch. Time is set from etch rate determination to remove approximately 2000 angstroms. Proper etch depth is verified both with a step height measurement and a probe for surface breakdown. Wafers are blanket exposed at 365 nm to soften the photoresist. The resist is then removed by acetone spray and a 5 minute ash in a downstream asher at 150° C., 400 watts in gas flows of 6 slm $O_2$ and 1 slm $N_2O$, at 4 torr. Particulate contamination is then removed in a water high pressure spray scrub. Wafers are ready at this point for the collector etch step. The resulting structure is shown in FIG. 13.

Collector contact regions are etched through the remaining collector layer 30 to the n+ subcollector 28 employing positive photoresist masking and the moderately undercutting etch described for both base and base mesa etch. The photoresist, slightly undercut by the $BCl_3:Cl_2$ RIE, is left in place as a lift-off mask for collector contact 52 evaporation. AuGe/Ni/Au contact metallization is evaporated over the wafer, and solvent lift-off, attacking the photoresist at the underside of the overhang left by the collector etch undercut, is employed to remove the resist and the excess metal. Wafers are then ashed to remove the final organic residues.

Figure 14:
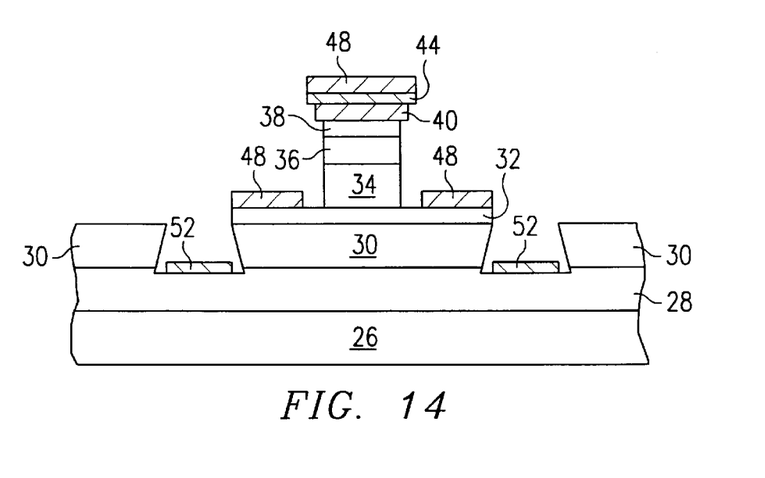

In a specific embodiment of this invention, the wafers are etched 30 seconds in 40:1 $H_2O:NH_4OH$, rinsed in flowing deionized water, and spin rinse dried. Adhesion promoter is applied, and positive photoresist is spun on, baked, aligned, exposed, developed, ashed 3 minutes at 150 watts, 900 millitorr in a barrel type asher, and baked 30 minutes @100° C. The wafers are again ashed 3 minutes at 150 watts, 900 mt in a barrel type asher. At this point, the resist thickness is measured to serve as a rough base line for determining etch depth. The wafers are then dipped 10 seconds in buffered HF to remove native oxides, rinsed in flowing deionized water, and spin rinse dried. The wafers are then etched as with the AlGaAs portion of the emitter etch. Time is set from etch rate determination to remove approximately 7700 angstroms. Proper etch depth is verified both with a step height measurement and a probe for surface breakdown. Wafers are then ashed 1 minute at 150 watts, 900 mt in a barrel type asher, etch cleaned 10 seconds in 1:8:160 ($H_2SO_4:H_2O_2:H_2O$) to remove etch damage, rinsed in flowing deionized water, spin rinsed and dried. AuGe-Ni-Au contact metallization is evaporated over the surface of the photoresist and into the etched collector contact regions. Photoresist undercut, occurring during the $BCl_3/Cl_2$ RIE, provides necessary edge shadowing to prevent metal continuity over resist sidewalls to collector contacts, thus permitting resist liftoff patterning of the collector contact. Resist and excess metal are removed by solvent liftoff, and ashed 5 minutes at 150 watts, 900 millitorr in a barrel type asher to remove organic residues. The resulting structure is shown in FIG. 14.

Electrical contacts and interconnections are made to emitter, base and collector regions. Interconnects are brought into these regions through vias in partially planarized dielectrics, ensuring that substrate leaks are eliminated, and resulting in devices which operate with higher efficiency and markedly lower power drain.

In a specific embodiment of this invention, the partially planarized dielectric film is formed as follows:

a. Following the ash step above, wafers are plasma pre-treated at 15 W, 50° C., and 260 millitorr in a gas mixture of Freon 13 B1 and $CF_4+8\%$ $O_2$ to enhance $Si_3N_4$ adhesion and reduce plasma induced damage from nitride and oxide deposition.

b. A dielectric film consisting of 1000 Angstroms $Si_3N_4$ followed by 10000 Angstroms $SiO_2$ is plasma deposited in a parallel plate reactor onto the wafers.

Approximate conditions for nitride deposition are:

Gas: 260 sccm 10% $NH_3$ in Ar, 540 sccm 5% $SiH_4$ in Ar, 850 sccm $N_2$

System pressure: 1000 millitorr

Deposition power: 40 Watts

Upper plate temperature: 40° C.

Lower plate temperature: 250° C.

Approximate conditions for oxide deposition are:

Gas: 540 sccm 5% $SiH_4$ in Ar, 650 sccm $N_2$

System pressure: 650 millitorr

Deposition power: 30 Watts

Upper plate temperature: 40° C.

Lower plate temperature: 250° C.

$Si_3N_4$ seals in the device surfaces and provides good adhesion to GaAs and Au layers. $SiO_2$ provides good insulation, good etch rate differential for plasma etchable interconnects or resistors, and good faceting for planarization sloping by ion milling or sputter etching.

c. The wafers are ion milled at near normal incidence to remove 5000 Angstroms. Essentially vertical oxide side walls are sloped at roughly 45 degrees by this etch. If sputter etching is employed instead of ion milling, the same degree of sidewall sloping can be achieved with removal of 1750+/−250 Angstroms. Initial oxide thickness should be reduced to approximately 7000 Angstroms if sputter etch is used instead of ion milling to slope oxide side walls. Side wall sloping is to ensure good lead thickness for interconnect over the elevated emitter and base and depressed collector topography.

d. Wafers are scrubbed in adhesion promoter high pressure spray and returned to the nitride/oxide deposition reactor for a 2000 Angstrom oxide deposition, making the oxide thickness over emitter, base, and collector contacts approximately 7000 Angstroms.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

Figure 15:
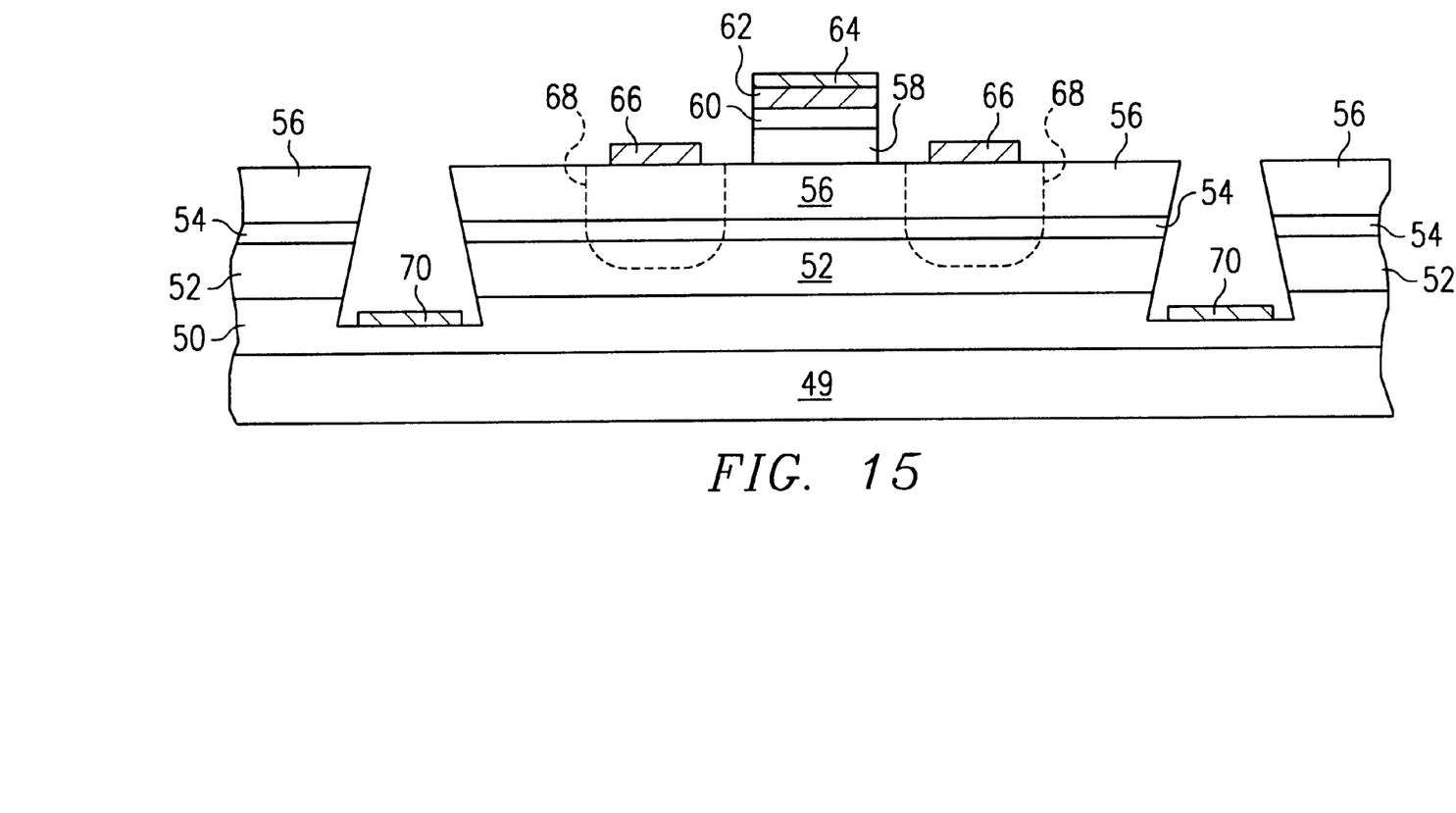
FIG. 15 is a cross-sectional diagram of a third preferred embodiment of the invention.

For example, an embodiment of the invention has been described hereinabove. This embodiment was an HBT of the emitter-up type, i.e. contact was made to an emitter mesa that protrudes from the surrounding substrate. As may be appreciated, the invention described herein may also be applied to HBTs of the collector-up type, an example of which is shown in FIG. 15. This transistor is similar to the emitter-up type in that it comprises a stack of selectively etched semiconductor layers on a semiconductor substrate 49. On the substrate 49 is placed an emitter contact layer 50 of n+ GaAs for example; an emitter layer 52 of n-doped AlGaAs or of GaInP for example; a base layer 54 of p+ GaAs, a buffer layer 56 of GaAs or AlGaAs for example, a collector layer 58 of GaAs for example and as in the embodiments described hereinabove, an InGaAs layer 60, a TiW layer 62, and layer of metal composition (preferably Au-based) 64.

However, unlike the emitter-up transistor described hereinabove, the collector-up transistor described in this embodiment has an intrinsic base set by implantation or diffusion of dopants through the buffer 56 and base 54 layers and into the emitter layer 52 as shown by the dashed line in FIG. 15. Contact is made to this region of implantation or diffusion by metal contacts 66. Implantation may be accomplished using Be. Zn is the preferred dopant for diffusion. AuZn may be used for the contacts 66. Contact is made to the emitter layer 52 by forming metal contacts 70, of AuGeNiAu for example, on the highly doped emitter contact layer 50.

Collector-up (or emitter-down) transistors have uses in logic, analog-linear, and microwave applications. An advantage of these devices is that parasitics associated with the collector-base interface are much reduced as compared to those of an emitter-up transistor.

What is claimed is:

1. A method comprising the steps of:

forming a semiconductor surface;

forming a layer of InGaAs over the semiconductor surface; and forming an electrical contact layer of TiW on the layer of InGaAs by sputtering TiW on the layer of InGaAs in an ambient gas sufficiently devoid of nitrogen to prevent a majority of Ti atoms at an interface between the layer of TiW and the layer of InGaAs from bonding with nitrogen.

2. The method of claim 1, further comprising forming an emitter mesa comprising the semiconductor surface, the layer of InGaAs, and the layer of TiW.

3. The method of claim 2 further comprising interposing a layer of GaAs between the semiconductor surface and the layer of InGaAs.

4. The method of claim 1, further comprising forming a collector mesa comprising a collector layer of GaAs, the layer of InGaAs, and the layer of TiW.

5. The method of claim 2 wherein the semiconductor surface is a surface of a region comprising AlGaAs.

6. The method of claim 2 wherein the semiconductor surface is a surface of a region comprising GaInP.

7. The method of claim 1, further comprising forming a composition of metal on the layer of TiW, the composition of metal containing Au.

8. The method of claim 1, wherein the layer of InGaAs is $In_{0.5}Ga_{0.5}As$.

9. A method for fabricating an integrated circuit, comprising the steps of:

forming a stack of semiconductor layers on a semiconductor substrate, the stack having a surface;

forming a layer of InGaAs over the surface;

forming an electrical contact layer of TiW on the layer of InGaAs by sputtering TiW on the layer of InGaAs in an ambient gas sufficiently devoid of nitrogen to prevent a majority of Ti atoms at an interface between the layer of TiW and the layer of InGaAs from bonding with nitrogen;

forming metallization on selected portions of the layer of TiW, each selected portion having a boundary; and removing portions of the stack and the layers that lie outside of the boundaries to form mesas comprising the stack of semiconductor layers and the layer of InGaAs and the layer of TiW.

10. The method of claim 9, wherein the semiconductor substrate is GaAs, the stack of semiconductor layers comprises: a GaAs subcollector layer, a GaAs collector layer, a GaAs base layer, and an AlGaAs emitter layer.

11. The method of claim 9, wherein the semiconductor substrate is GaAs, the stack of semiconductor layers comprises: a GaAs subcollector layer, a GaAs collector layer, a GaAs base layer, and a GaInP emitter layer.

12. The method of claim 9, wherein the metallization contains Au.

13. The method of claim 9, further comprising the step of doping the layer of InGaAs with silicon to a concentration of approximately $1 \times 10^{19}$ $cm^{-3}$.

* * * * *